US00RE35797E

United States Patent [19]

Graham et al.

[11] E Patent Number: Re. 35,797

[45] Reissued Date of Patent: May 19, 1998

[54] LOGIC ARRAY HAVING HIGH FREQUENCY INTERNAL CLOCKING

[75] Inventors: Andrew C. Graham, Austin, Tex.; Michael G. France, Portland, Oreg.; Robert C. Burd, Santa Clara; Mark E. Fitzpatrick, San Jose, both of Calif.

[73] Assignee: TriQuint Semiconductor, Inc., Hillsboro, Oreg.

[21] Appl. No.: 425,753

[22] Filed: Apr. 19, 1995

(Under 37 CFR 1.47)

Related U.S. Patent Documents

Reissue of:

[64] Patent No.: 5,204,555
Issued: Apr. 20, 1993
Appl. No.: 863,327
Filed: Apr. 2, 1992

U.S. Applications:

[63] Continuation of Ser. No. 505,953, Apr. 5, 1990, abandoned.

[51] Int. Cl.[6] ..... H03K 7/38

[52] U.S. Cl. ..... 326/40; 326/41; 326/96; 327/157; 327/298

[58] Field of Search ..... 326/40, 41, 96; 327/157, 298

[56] References Cited

U.S. PATENT DOCUMENTS

| | | | |
|---|---|---|---|
| 4,124,899 | 11/1978 | Birker et al. | 364/716 |
| 4,758,746 | 7/1988 | Birkner et al. | 307/465 |
| 4,912,342 | 3/1990 | Wong et al. | 307/465 |
| 4,922,141 | 5/1990 | Lofgren et al. | 307/595 |
| 4,939,391 | 7/1990 | Young et al. | 307/465 |
| 4,959,646 | 9/1990 | Podkowa et al. | 307/465 |
| 4,990,801 | 2/1991 | Caesar et al. | 307/465 |
| 5,052,028 | 9/1991 | Zwack | 375/109 |
| 5,075,575 | 12/1991 | Shizukuishi et al. | 307/480 |
| 5,095,233 | 3/1992 | Ashby et al. | 307/603 |
| 5,101,117 | 3/1992 | Johnson et al. | 307/269 |
| 5,138,320 | 8/1992 | Ngo et al. | 341/173 |
| 5,146,121 | 9/1992 | Searles et al. | 307/603 |
| 5,159,205 | 10/1992 | Gorecki et al. | 307/269 |
| 5,179,303 | 1/1993 | Searles et al. | 307/603 |
| 5,218,314 | 6/1993 | Efendovich et al. | 328/155 |
| 5,287,025 | 2/1994 | Nishimichi | 307/603 |
| 5,337,285 | 8/1994 | Ware et al. | 365/227 |
| 5,349,544 | 9/1994 | Wright et al. | 364/600 |
| 5,371,764 | 12/1994 | Gillingham et al. | 375/106 |
| 5,384,541 | 1/1995 | Chu et al. | 324/617 |
| 5,412,697 | 5/1995 | Van Brunt et al. | 375/360 |
| 5,420,531 | 5/1995 | Wetlaufer | 327/270 |

FOREIGN PATENT DOCUMENTS

| | | |
|---|---|---|
| 0266065 | 5/1988 | European Pat. Off. . |
| 2045488 | 10/1980 | United Kingdom . |
| 2121573 | 12/1983 | United Kingdom . |

OTHER PUBLICATIONS

GA23SV8/GA23S8, "High-Performance Logic Device Gallium Arsenide", Gazelle Microcircuits, Inc., pp. 1–12, Apr. 1989.

PAL20RA 10–20, "Programmable Array Logic", MMI, 5–95 to 5–102, Apr. 1989.

Am2971, "Programmable Event Generator (PEG)", pp. 4–286 to 4–303, AMD, Apr. 1989.

AmPAL* 23S8, pp. 4–102 to 4–121, AMD/MMI, Apr. 1989.

*Primary Examiner*—Margaret Rose Wambach

*Attorney, Agent, or Firm*—Skjerven, Morrill, MacPherson, Franklin, & Friel; Brian D. Ogonowsky

[57] ABSTRACT

A state machine is configured with a phase-locked loop clock signal generator which can operate at a rate faster than an externally generated reference clock signal applied to the phase-locked loop. The output of the phase-locked loop is used to trigger registers coupled to the state machine at a selected rate to enable signals at output terminals of the state machine to be updated at a rate different than the rate of the externally generated reference clock signal.

57 Claims, 8 Drawing Sheets

78
FILTER
82
VCO
80
CLK BUF
83
CLK2
175
174
171
170
177
176
147
AND ARRAY 10
END COUNT FF
128
145
120
119
166
D
G
O
J
K
Q

LOGIC ARRAY HAVING HIGH FREQUENCY INTERNAL CLOCKING

Matter enclosed in heavy brackets [ ] appears in the original patent but forms no part of this reissue specification; matter printed in italics indicates the additions made by reissue.

This application is a continuation of application Ser. No. 07/505,953, filed Apr. 5, 1990 now abandoned.

CROSS-REFERENCE TO RELATED APPLICATIONS

The following U.S. Patents and co-pending application are assigned to the same assignee of the present application and are related to the present application:

a. "Current Pump Structure" by Mark Fitzpatrick et al., U.S. Pat No. 5,063,343;

b. "Floating Transistor Switch" by Mark Fitzpatrick et al., U.S. Pat. No. 5,004,971;

c. "A New Phase/Frequency Detector" by Robert Burd et al., filed concurrently herewith and assigned Ser. No. 07/508,856; and d. "Translator Circuit for Converting ECL Type Signals to TTL Type Signals" by Mark Fitzpatrick et al., U.S. Pat. No. 5,030,854.

The disclosures of these concurrently filed applications are incorporated herein by reference.

FIELD OF THE INVENTION

This invention relates to logic arrays, or state machines, and in particular to programmable logic arrays for providing output signals having programmable output states in response to one or more input signals.

BACKGROUND OF THE INVENTION

Programmable logic arrays are well known in the art. Generally, a programmable logic array consists of a first array of AND gates having their inputs programmably coupled to input terminals of the logic array chip. The outputs of the various AND gates forming the AND array are coupled, either programmably or nonprogrammbly, to inputs of an OR array. The outputs of the OR array are then coupled to output terminals of the logic array chip so that a signal provided at in output terminal may be a sum of a product of a plurality of input signals applied to the input terminals of the chip. An extremely wide variety of logic functions may be obtained with this generic type of programmable logic array circuit. On such programmable logic array circuit is described in U.S. Pat. No. 4,124,899, issued to Birkner et al., incorporated herein by reference.

A modification of the basic programmable logic array design described in U.S. Pat. No. 4,124,899 is the Gazelle Microcircuit, Inc. Model GA23SV8 programmable logic array sequencer, described in the GA23SV8 data book (April 1989), incorporated herein by reference. This sequencer uses what is known in the art as buried registers, whose inputs are coupled to the outputs of an OR array and whose outputs are programmably coupled to the inputs of an AND array to provide an internal feedback path. In the Model GA23SV8 sequencer, these buried registers are D flip flops. Thus, the outputs of these buried registers are treated in the same way as input signals applied to the input terminals of the logic array chip.

Clocked output registers in the GA23SV8 sequencer are connected to receive an associated output signal from the OR array and output a signal through a buffer to an associated output terminal of the logic array chip. The output signal provided at the output terminals may also be fed back into the logic array and treated as an additional input signal into the AND array. In the GA23SV8 sequencer, these output registers are D flip flops.

One known application of buried and/or output registers is to configure them as a counter, where the logic array is programmed such that the output of one or more of the registers provides input signals to the AND array corresponding to the number of counting operations performed by the counter. For example, it may be desirable for an input signal to go high after eight counts. Accordingly, the logic array would be programmed for the registers to act as a binary counter, and outputs of the appropriate registers would be applied to the input of the AND array to signal the occurrence of every eighth count.

In the Model GA23SV8 sequencer and in the numerous other programmable logic device (PLD) products on the market, a common externally generated clock pulse is applied to all registers in the programmable logic array chip so that all the registers change states, or are otherwise updated, simultaneously.

One type of PLD which does not couple a single clock signal to all registers is the Model PAL20RA10 available from Advanced Micro Devices (AMD), Inc. In the Model PAL20RA10, each register has its clock input terminal connected to a separate output of a logic array to selectively control the timing of each register.

The maximum clocking rate of a register is the rate of an externally generated input signal applied to the clock input of the register through the logic array.

One circuit which uses a high speed internally generated clock signal to clock output registers is the Model Am2971 Programmable Event Generator (PEG) by AMD. The Model Am2971 uses a phase-locked loop (PLL) to generate a clock signal to clock output registers. The output registers are also used to feed back address signals into a programmable read only memory (PROM). The feedback signals are then decoded by the PROM, which applies the data contained in the address to the output registers. A portion of the data is provided to output terminals of the PEG, while a portion of the data is used as address signals to address data in the PROM. However, since the PROM is unable to generate a feedback signal for controlling the phase of the PLL used to clock the output registers, the output signals from the PROM are not synchronized with the externally generated clock reference signal applied to the PLL Thus, the Am2971 would not be well suited for applications where output signal transitions of the Am2971 must be synchronized with transitions of an externally generated reference signal.

Applicants have discovered a heretofore unsatisfied need in the art for a monolithic logic array circuit with the ability to clock internal registers using an internally generated clock signal. Prior art monolithic logic array circuits are unable to provide any of the numerous benefits, which will be discussed below, obtained by clocking registers at a rate faster than the externally generated clock pulse applied to the logic array chip.

SUMMARY OF THE INVENTION

The flexibility of a monolithic logic array circuit, or state machine, using registers has been significantly increased by the inclusion of a clock signal generator within the chip which can operate at a rate faster than an externally generated clock signal applied to the chip. The clock signal generator within by the clock signal generator within the chip is used to trigger each of the registers within the chip at a selected rate to enable internal buried registers and/or output registers to provide input signals into the logic array and/or output signals from the logic array at the selected rate.

Hence, by using this structure, a set of externally generated input signals applied to the chip during a single clock cycle of a clock signal applied to the chip may give rise to any number of sequential operations internal to the logic array chip, depending on the frequency of the chip's internal clock generator and the programmed connections of the logic array.

Such a device, for example, enables a user to apply a 10 MHz clock signal to an input pin of the chip and generate a 500 MHz internal clock for application to the registers internal to the chip. Thus, the internal registers may be updated with new data at a rate of as much as 500 MHz. Since the outputs of these registers may be applied to the inputs of the logic array, the logic array may perform as many as 50 operations for every externally generated clock pulse applied to the chip.

In a preferred embodiment, the internal clock is generated by a phase-locked loop which uses an externally generated clock signal as a reference and a signal from an output register as a feedback signal to be compared with the reference signal. By programming the logic array, the internal clock may be selected to operate at a wide variety of frequencies One extremely important use of this novel structure is as a multi-phase clock buffer, wherein the various outputs of the chip change states at the same rate as the clock signal applied to the chip but incorporate individual selected delays to correct for any propagation delay between the outputs of the chip and devices connected to these outputs. Without an internal clock having a frequency much higher than the externally generated clock signal applied to the chip, this multi-phase clock function would be impossible, since all clock signal outputs of the chip would necessarily change states simultaneously in accordance with the externally generated clock signal.

A further use of this novel device is as a DRAM controller, where timing signals having selectable pulse widths, rates, and phases are generated to control the various operations of a DRAM.

Additional uses of this novel device are as a clock multiple generator, a multi-output waveform generator, and a low-skew clock buffer.

An additional novel feature of one embodiment of this device is the coupling of the buried state registers' inputs and outputs directly to an AND array within the monolithic logic array. In the prior art, buried registers have an input coupled to the output of the summing (OR) array and have an output coupled to the input of the product (AND) array. This novel feature of the present invention enables the buried registers to operate at a much higher clock rate than if the buried registers were connected to the outputs of the summing array.

BRIEF DESCRIPTION OF THE DRAWINGS

FIGS. 4–8 illustrate various applications of the circuits shown in FIGS. 1 and 3 wherein:

FIG. 4 illustrates the circuits configured as a clock multiple generator;

FIG. 5 illustrates the circuits configured as a multi-output waveform generator;

FIG. 6 illustrates examples of output signals which may be generated by the structure of FIG. 5 by appropriate programming of the structure of FIG. 5;

FIG. 7 illustrates the circuits configured as a low-skew, zero delay clock buffer; and FIG. 8 illustrates the circuits configured as a multi-phase clock buffer.

DETAILED DESCRIPTION OF PREFERRED EMBODIMENT

Although numerous possible variations of the circuitry within the herein described novel logic array chip having an internal clock generator are intended to be within the scope of this disclosure, a representative structure will be shown in detail to illustrate the various inventive concepts disclosed herein.

Figure 1:
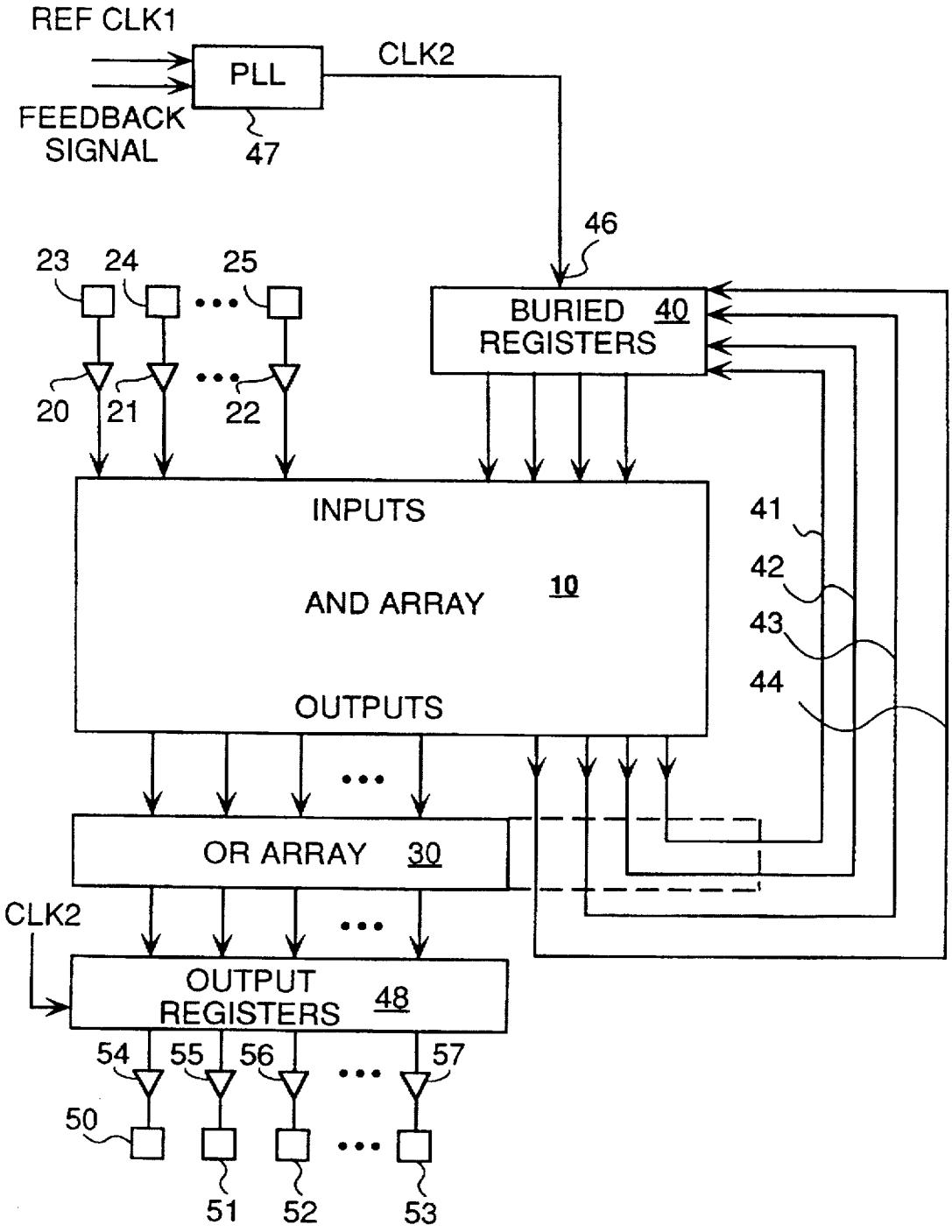
FIG. 1 shows one embodiment of the invention using an internally generated clock signal to control internal registers.

FIG. 1 shows one embodiment of the invention using a programmable AND array 10, which may be any type of programmable AND array or its logic equivalent, such as that described in U.S. Pat. No. 4,124,899 and 4,758,746 and the GA23SV8 data sheet, all incorporated herein by reference.

Figure 2A:
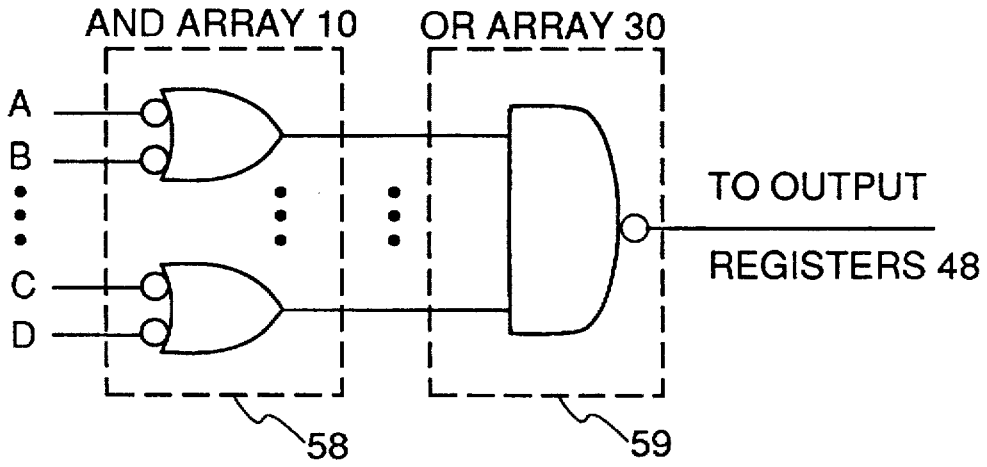
FIGS. 2a and 2b demonstrate the equivalent circuitry used in one embodiment to implement an AND array followed by an OR array.
Figure 2B:
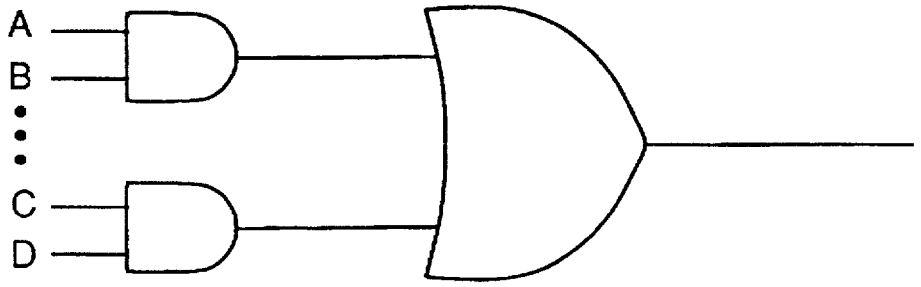

Although an AND array and an OR array are represented in FIG. 1, these arrays may be implemented in accordance with deMorgan's theorem using other than AND and OR gates to form the logical equivalent of an AND array coupled to an OR array. For example, in the preferred embodiment, AND array 10 followed by OR array 30 is actually implemented using circuitry represented by the logic symbols shown in blocks 58 and 59 of FIG. 2a. This circuitry is logically equivalent to AND gates followed by an OR gate, as shown in FIG. 2b.

If the logic array chip is fabricated for a specific application, AND array 10 could be mask or laser programmed during fabrication. If it is desired for the circuit to be programmed by the user, AND array 10 may be made field programmable.

Programmably coupled to the inputs of any of the plurality of gates in AND array 10 are input buffers 20, 21, and 22, having inputs coupled to input terminals 23, 24, and 25, respectively. There may be more or less input terminals as required for a specific application. Functionally, outputs of AND array 10 are the various logical products of the input signals applied to the input of AND array 10 in accordance with the programmed connections within AND array 10.

The outputs of selected gates within AND array 10 are applied to an array of gates within OR array 30 to functionally perform a summing of any of the outputs of the gates in AND array 10. The connections between the gates within AND array 10 and the gates within OR array 30 may be fixed or programmable. Additionally, output lines from any number of gates in AND array 10 may also be programmably connected to the inputs of buried registers, shown in block diagram form as buried registers 40. Each selected output line of AND array 10, such as one of AND array output lines 41–44, is directly connected to an input terminal of an associated buried register. Each buried register responds to the signal on an associated AND array output line 41–44 whenever a clock pulse is applied to the buried register clock input 46.

In an alternative embodiment, OR array 30 may be extended so as to perform a summing operation on product terms generated by AND array 10 and output sum of product terms on lines 41–44 for application to buried registers 40. However, by not coupling input terminals of buried registers 40 directly to outputs of AND array 10, some delay time and capacitive loading is incurred, possibly reducing the maximum clocking speed of buried registers 40. Hence, depending upon the intended application, buried registers 40 may or may not be coupled to OR array 30.

The clock pulses applied to buried register clock input 46 are generated by clock generator 47 internal to the chip. The clock signal generated by clock generator 47 is termed CLK2. In the example shown in FIG. 1, clock generator 47 is a phase-locked loop (PLL) which uses as a reference the externally generated common clock signal CLK1 applied to an input pin of the logic array chip. A feedback signal also applied to PLL 47 may be a divided CLK2 signal, where this divided CLK2 signal is kept in phase with clock signal CLK1. For most applications, clock signal CLK2 will be of a higher frequency than the externally generated clock signal CLK1; however, clock signal CLK2 may also be of a lower frequency than clock signal CLK1. In the latter case, the feedback signal into PLL 47 would be a multiplied CLK2 signal.

In one embodiment, buried registers 40 comprise individual J-K flip flops configured as toggle T flip flops, wherein the output of a T flip flop changes states when an input signal is a logical 1 and a clock is applied to the clock input of the T flip flop. Although this T flip flop may be useful in certain applications, a D flip flop, an R-S flip flop, a J-K flip flop (not configured as a T flip flop), or other type of flip flop may also be used as a buried register for other applications.

The output of each of the buried registers in buried register block 40 is programmably connected to inputs of the gates in AND array 10 such that the outputs of the buried registers may be ANDed with any of the inputs signals applied to input terminals 23–25 or with any of the other outputs of the buried registers.

Since the buried registers in buried register block 40 are triggered in accordance with the frequency of the internally generated clock signal CLK2, AND array 10 may be provided with input signals which can change states at the clock rate of clock signal CLK2. Thus, the outputs of AND array 10 and OR array 30 may also change states at the clock rate of CLK2.

The outputs of the OR gates in OR array 30 are applied to associated terminals of output registers within output register block 48. These output registers may be any type of flip flop appropriate for a particular application, such as J-K flip flops. The output registers are triggered in accordance with clock signal CLK2 so that the output signals applied to output terminals 50–53 may be updated at the clock rate of clock signal CLK2. More or less output terminals may be used as appropriate for a particular application. Output buffers 54–57 are connected in one embodiment between output registers 48 and output terminals 50–53, respectively.

Figure 3A:
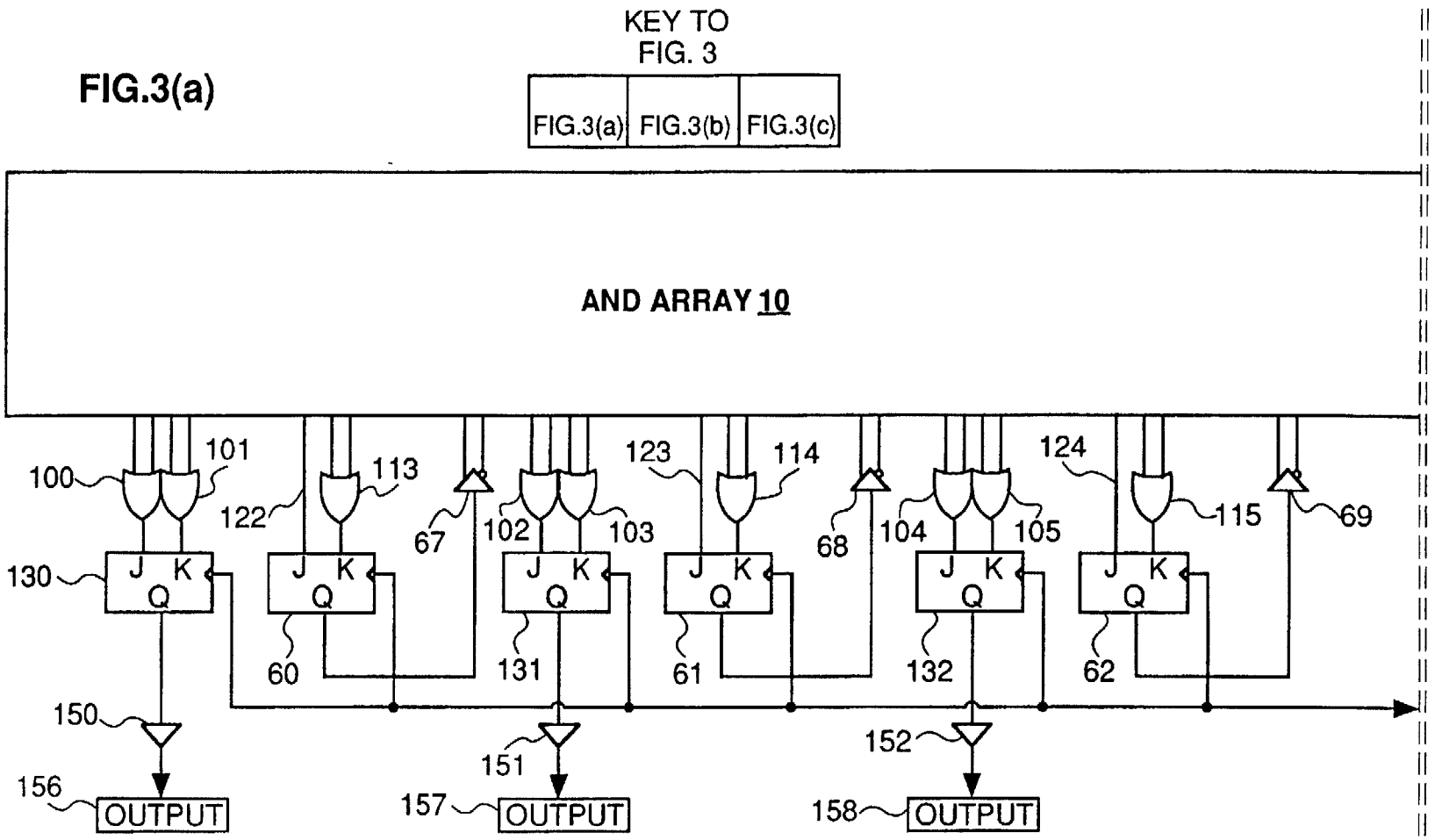
FIGS. 3(a) 3(b) and 3(c) compose FIG. 3, which shows an embodiment of FIG. 1 in more detail.
Figure 3B:
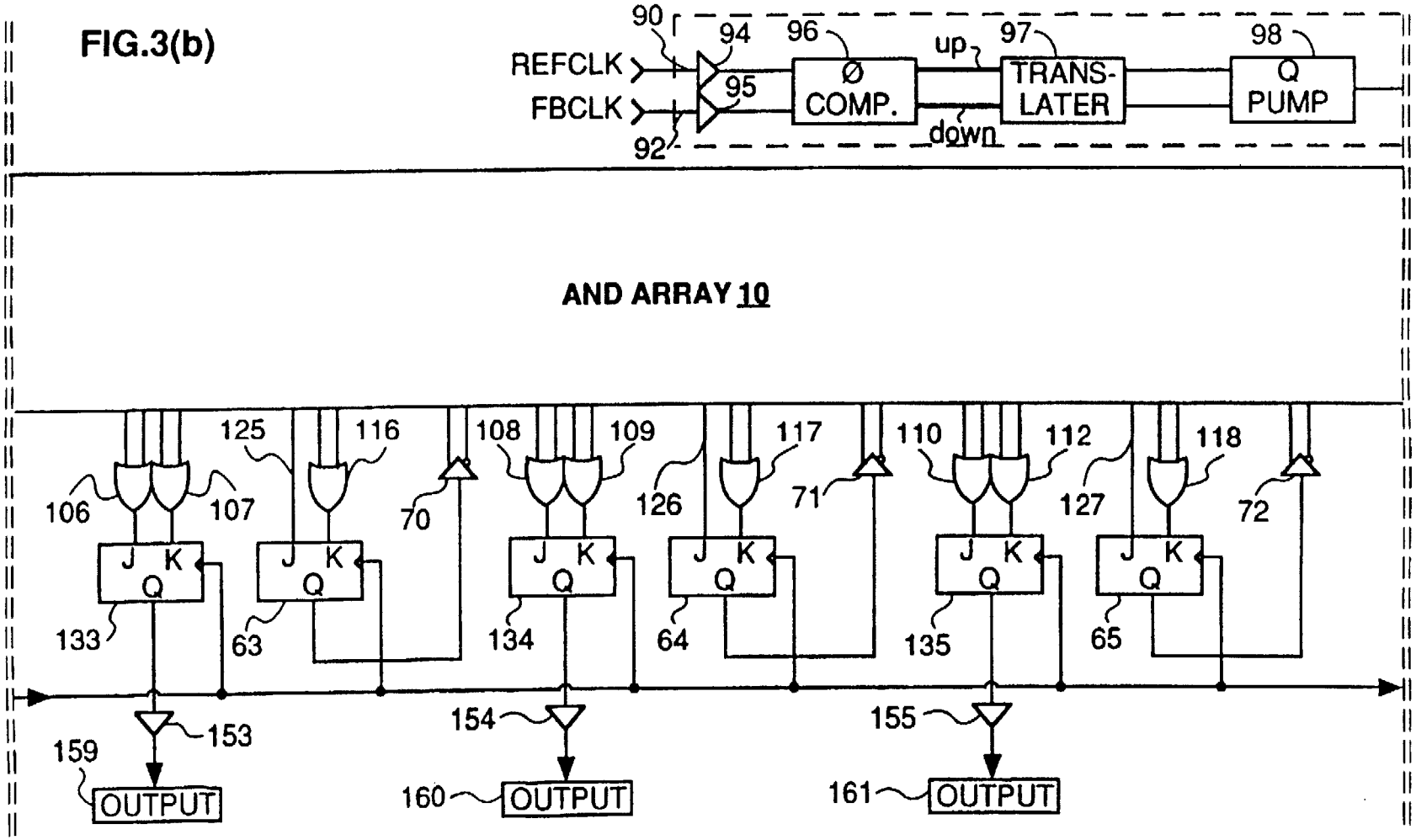
Figure 3C:
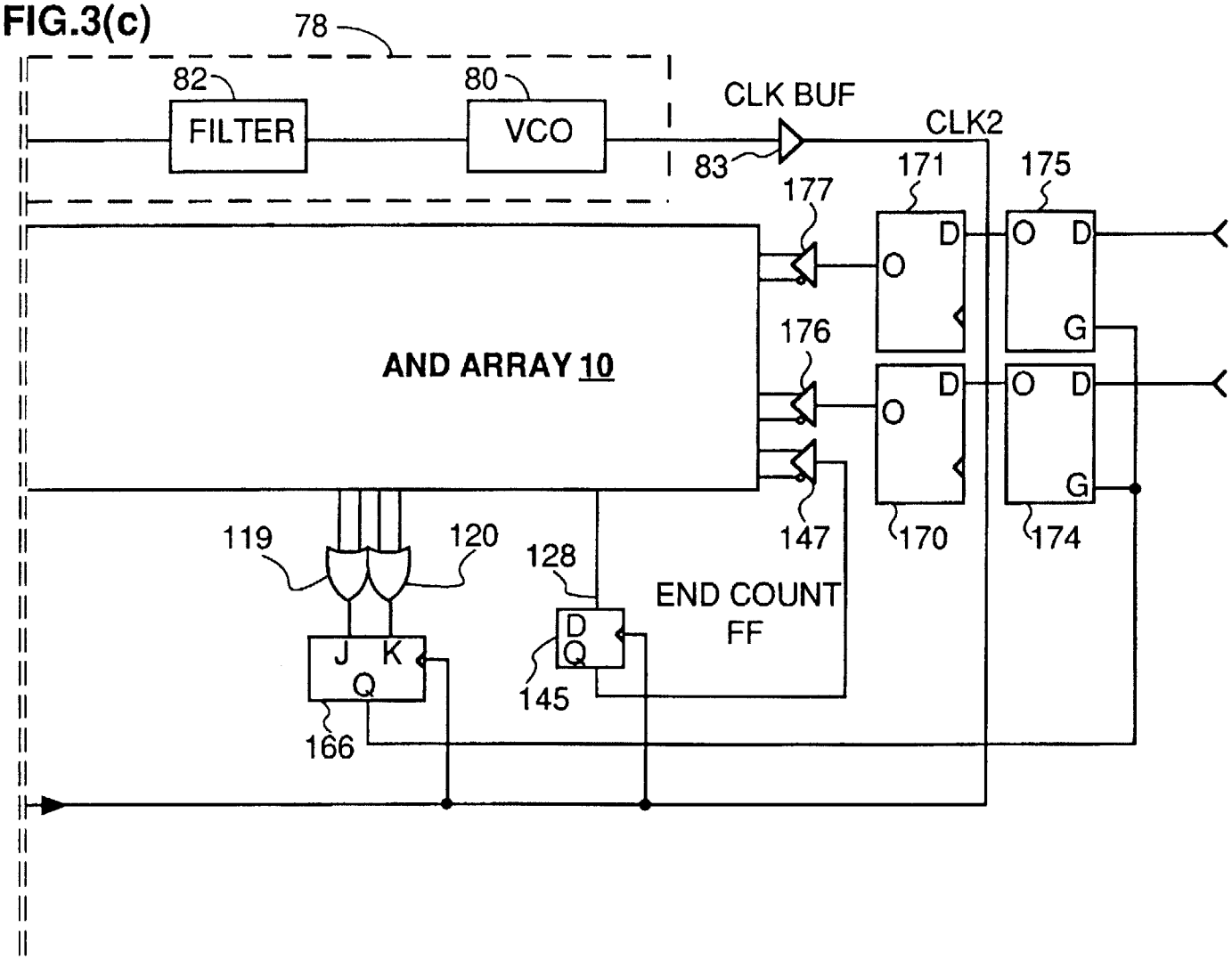

FIG. 3 shows a specific embodiment of the circuit of FIG. 1 which is especially useful in generating periodic control signals. In FIG. 3, the buried registers of FIG. 1 are shown as J-K flip flops 60–65, although these flip flops may be any type of flip flop, such as D flip flops. Output signals from AND array 10 are applied to the J and K inputs of J-K flip flops 60–65, while the Q output of each of the J-K flip flops 60–65 are applied through an associated buffer means 67–72 to an input of AND array 10. Buffers 67–72 provide both an inverted output ($\overline{Q}$) and a non-inverted output (Q) in the embodiment shown in FIG. 2 In another embodiment, each J-K flip flop 60–65 may have a Q and $\overline{Q}$ output, where a separate buffer, if necessary may be connected to each Q and $\overline{Q}$ output.

AND array 10 is programmed to configure J-K flip flops 60–65 as T flip flops by causing the J and K input signals to be of a same level.

Additional outputs of AND array 10 or OR array 30 may be used for any purpose, such as for controlling tristate buffers or any other use previously used in logic array circuits.

Applied to each of the clock inputs of buried registers 60–65 is clock signal CLK2 generated by a phase-locked loop (PLL) 78, comprising voltage controlled oscillator (VCO) 80, which generates a pulse train having a frequency dependent upon a DC voltage applied to the input of VCO 80. Filtering means 82 is coupled between the input of VCO 80 and the output of charge pump 98 to filter out AC signals and to maintain a DC voltage applied to VCO 80. Clock buffer 83 buffers the output of VCO 80.

To ensure the output of VCO 80 is at a desired rate, the output of VCO 80 is divided by appropriate means to generate a feedback signal to be applied to an input of PLL 78 in order for this feedback signal to be compared with a reference clock, such as the system's externally generated clock. In the embodiment of FIG. 3, the reference clock is coupled to PLL reference terminal 90, while the feedback signal is applied to PLL feedback terminal 92. These two signals are buffered by buffer means 94 and 95 and compared using phase comparator 96. If comparator 96 senses that the frequency or phase of the signal applied to reference terminal 90 is different from that of the signal applied to feedback terminal 92, comparator 96 will supply up or down signals at its respective UP and DOWN output terminals to cause charge pump 98 to raise or lower the output of filtering means 82 so as to change the output frequency of VCO 80 and match the feedback signal to the reference signal. In a preferred embodiment, translator circuit 97 is inserted between charge pump 98 and comparator 96 to convert small voltage swing complementary input signals to large swing TTL type signals.

In one embodiment, filtering means 82 is made variable to accommodate a range of input signal frequencies applied to terminals 90 and 92. Any suitable PLL may be used in place of PLL 78 shown in FIG. 3. Phase comparator 96 may be that described in disclosure c, charge pump 98 may be that described in disclosures a and b, and translator circuit 97 may be that described in disclosure d, identified in the Cross-Reference to Related Applications section.

In FIG. 3, the OR array, shown as OR array 30 in FIG. 1, consists of fixed functional OR gates 100–120, each having two inputs, where each input is coupled to an output of an associated gate in AND array 10. Each OR gate of OR gates 100–112 is coupled to a respective J or K input of an associated one of J-K flip flops 130–135, used as output registers. Each of these J-K flip flops 130–135 has applied to its clock input terminal the output (CLK2) of VCO 80.

Each OR gate of OR gates 113–118 is coupled to a K input of an associated one of J-K flip flops 60–65, used as buried registers, while lines 122–127 are coupled from AND array 10 to a J input of an associated one of J-K flip flops 60–65.

Each of J-K flip flops 60–65 has applied to its clock input terminal the output (CLK2) of VCO 80. In this embodiment, the J and K inputs of J-K flip flops 60–65 are made to normally have the same levels by the appropriate configuring of AND array 10 so J-K flip flops 60–65 acts T flip flops. In order to reset J-K flip flops 60–65, OR gates 113–118 are used to allow a high signal to be applied to the K input while a low signal is applied to the J input. If this reset feature is not required, OR gates 113–118 may be omitted.

Additional OR gates way be inserted in lines 122–128 if it is more desirable to construct the device to require all register input signals to pass through the OR array.

A reset signal for application to the K inputs of flip flops 60–65 to reset J-K flip flops 60–65 may be generated by incorporating end count register 145, which may be a D flip flop or any other type of flip flop. The programming of AND array 10 causes end count register 145 to apply a signal via buffer 147 to the input of AND array 10 upon detection of any predetermined clock count. This signal is acted upon by AND array 10 and the appropriate OR gates to apply a high signal to the K inputs of any of J-K flip flops 60–65 and a low signal to the respective J inputs to reset these flip flops. Line 128 couples end count register 145 to the output of AND array 10. An OR gate may be inserted in line 128 if multiple end count inputs are desired.

It should be noted that the OR array may comprise any combination of functional OR gates having any number of inputs and may be programmable or non-programmable.

Output buffers 150–155 connect the Q outputs of J-K flip flops 130–135 to respective output terminals 156–161 of the logic array chip. In another embodiment, J-K flip flops 130–135 have Q and $\overline{Q}$ outputs which may be programmably coupled to respective output terminals 156–161. In another embodiment, output buffers 150–155 may be programmed to provide an inverted, non-inverted, or disabled output to respective output terminals 156–161. Virtually any appropriate technique previously used in logic arrays to couple a signal to an output terminal may be used. The specific embodiment used depends on the intended application for the logic circuit.

The Q output of J-K flip flop 166 is used as a separate enable signal for latching in externally generated input signals applied to the logic array chip as explained below. OR gates 119 and 120 couple J-K flip flop 166 to AND array 10. In the embodiment shown in FIG. 3, D flip flops 170 and 171 have their D inputs coupled to the Q outputs of latches 174 and 175, respectively. The clock input terminals of D flip flops 170 and 171 are coupled to clock signal CLK2 so that any state changes of the Q output of D flip flops 170 and 171 will occur simultaneously with all other registers having clock inputs coupled to clock signal CLK2. The enable signal input terminals of latches 174 and 175, however, are coupled to the Q output of J-K flip flop 166, where the Q output of J-K flip flop 166 may trigger at any rate less than CLK2 and at any time interval during a reference clock signal cycle, chosen by the appropriate programming of AND array 10. Thus, externally generated input signals applied to the inputs of latches 174 and 175 can only be applied to the inputs of D flip flops 170 and 171 when a high level of the Q output of J-K flip flop 166 is applied to the enable input terminals of latches 174 and 175.

Since the Q output of J-K flip flop 166 is applied to the enable input terminals of latches 174 and 175, the user ideally times the Q output of J-K flip flop 166 so that input signals applied to latches 174 and 175 are stable prior to the time latches 174 and 175 are enabled. This ensures that the inputs into D flip flops 170 and 171 will be stable at a time when a CLK2 clock pulse is applied to the clock terminals of flip flops 170 and 171 to avoid metastable operation of D flip flops 170 and 171. Thus, latches 174 and 175 in conjunction with D flip flops 170 and 171 help ensure that signals applied to AND array 10 are either fully high or fully low.

Any type of suitable synchronization means may be substituted for latches 174 and 175 to avoid metastable operation of D flip flops 170 and 171. For example, a serial string of flip flops clocked at the rate of CLK2 may be used, instead of latches 174 and 175, to reduce the likelihood of metastable operation of D flip flops 170 and 171. Additionally, D flip flops 170 and may be deleted, if desired, so that the outputs of latches 174 and 175 are applied directly to AND array 10.

The Q outputs of D flip flops 170 and 171 are coupled to the inputs of AND array 10 via buffers 176 and 177. In another embodiment, Q and $\overline{Q}$ outputs of D flip flops 170 and 171 are applied either directly to AND array 10 or through buffers.

Thus, configuration shown in FIG. 3 insures that all input signals applied to AND array 10 are reliably clocked into AND array 10 at a rate of CLK2.

Depending on the intended application, there may be any number of input registers corresponding to flip flops 170 and 171 and to latches 174 and 175. Various applications of the circuit of FIG. 3 and the respective input signals into latches 174 and 175 will be discussed later with respect to FIGS. 4–8. PLL 78 may be taken from any output terminal 156–161 of the logic array chip or from any terminal internal to the chip. For example, if clock signal CLK2 is to have a frequency of eight times that of the reference signal applied to reference terminal 90 (e.g., an externally generated clock signal), AND array 10 could be configured such that a signal on output terminal 156 changes states on every eighth pulse of clock signal CLK2, such as would occur in a counter on the fourth least significant bit. The signal on output terminal 156 would then be coupled to feedback terminal 92 of PLL 78 to be synchronized with the reference signal applied to reference terminal 90.

AND array 10 in FIG. 3 may be readily programmed using mask laser, or field programming by one of ordinary skill in the art to create logic array chips for at least the applications described with respect to FIGS. 4–8.

Figure 4:
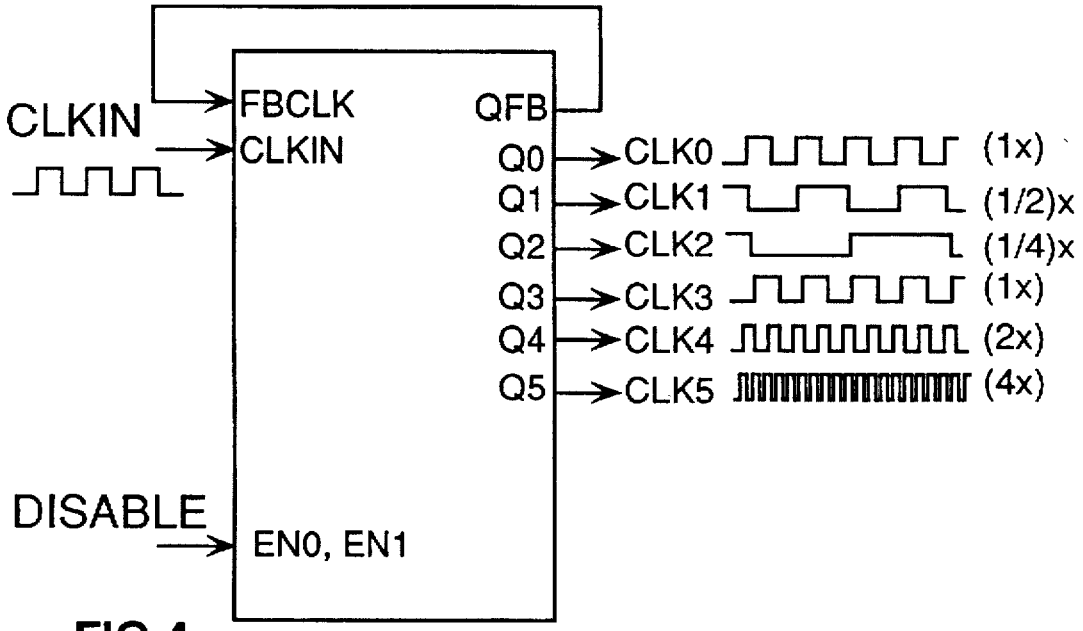

Specifically, FIG. 4 shows a configuration where the structure of FIG. 3 is configured as a clock multiple generator.

To use the circuit of FIG. 3 as a clock multiple generator, as shown in FIG. 4, an externally generated clock signal CLKIN is coupled to reference terminal 90 of PLL 78 in FIG. 3 through a pin of the chip. To maintain a desired PLL 78 output frequency, AND array 10 is programmed so that a Q output (Q0–Q5 in FIG. 4) of any one of J-K flip flops 130–135 changes states at the same rate as CLKIN for a selected CLK2 rate. This Q output is coupled to feedback terminal 92 to keep the Q output of this J-K flip flop in phase with clock signal CLKIN. This connection to feedback terminal 92 may be made internal or external to the chip. Hence, the clock signal output of PLL 78 will be maintained at a desired rate.

Applied to the input latch 174 or 175 in FIG. 3 are disable/enable signals which may be used to additionally control the outputs of the chip as desired by the appropriate programming of AND array 10.

By the appropriate programming of AND array 10 to cause the states of the various J-K flip flops 130–135 to change at a desired rate, any multiple or fraction of clock signal CLKIN may be generated and applied to output pins Q0–Q5.

Of-course, more or less J-K flip flops and output terminals may be added to the logic array chip of FIG. 3 to accommodate any number of clock outputs desired Advantages of this clock multiple generator of FIG. 4 include the following:

a. Each output is individually programmable;

b. Zero propagation delay possible for each clock output;

c. All outputs synchronous and phase-aligned;

d. Complement waveforms available on each output by using appropriate programming of AND array 10;

e. All outputs phase-aligned or selectively phase-shifted, as desired, with CLKIN.

Figure 5:
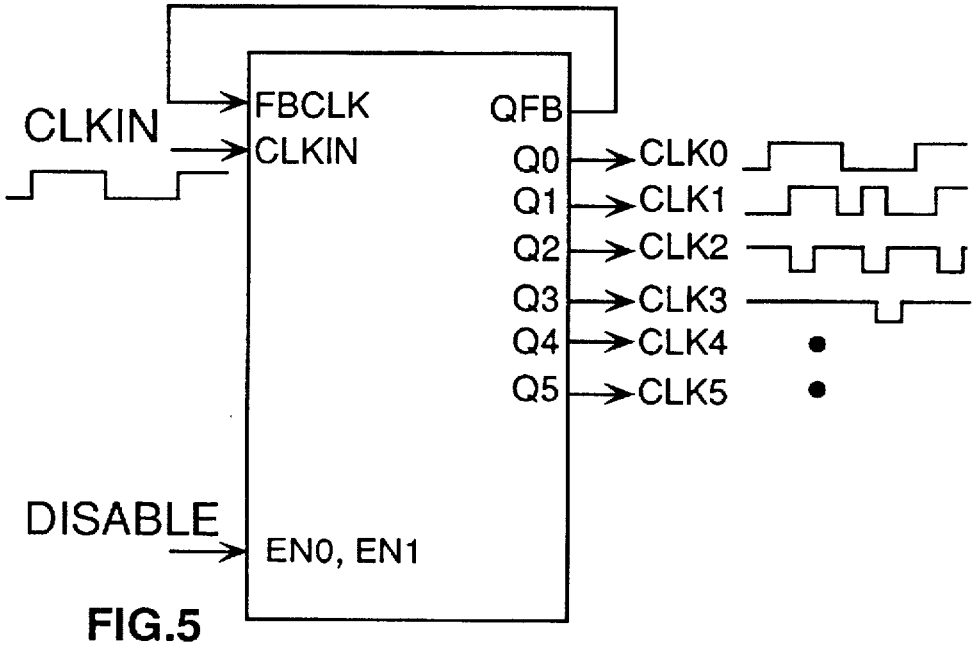
Figure 6:
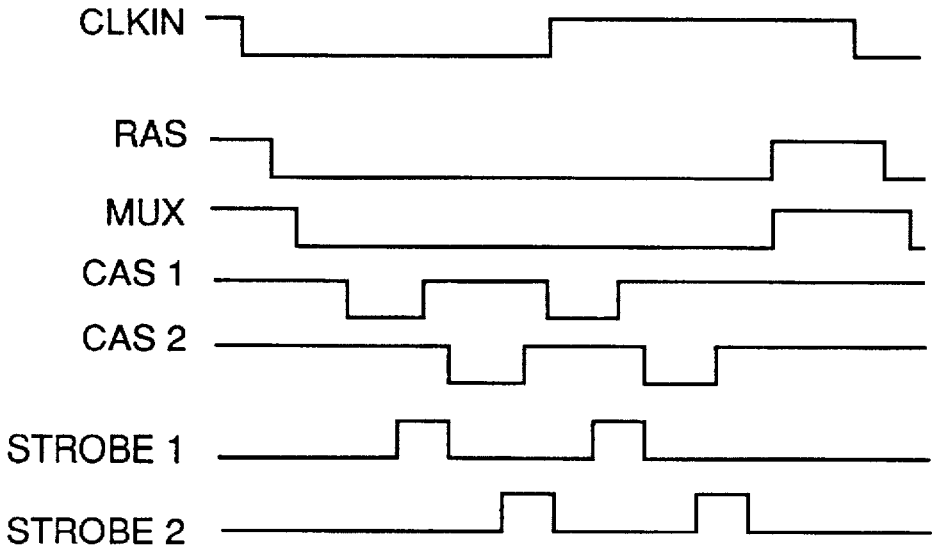

FIG. 5 shows a configuration where the structure of FIG. 3 is configured as a multi-output waveform generator. In the configuration of FIG. 5, the output signals at terminals Q0–Q5 of the logic array chip are clock signals which change states at programmable periods. The CLKIN signal, disable/enable signal, and feedback signal are applied to the chip as described with respect to FIG. 4. One of ordinary skill in the art will readily understand how to program AND array 10 in FIG. 3 to output clock signals on output terminals 156–161 having the desired characteristics. The configuration of FIG. 5 is ideal for controller applications where controls signals are generated at outputs Q0–Q5 to control various external devices. For example, DRAM control signals, such as those shown in FIG. 6, may be generated by appropriate programming of AND array 10.

Figure 7:
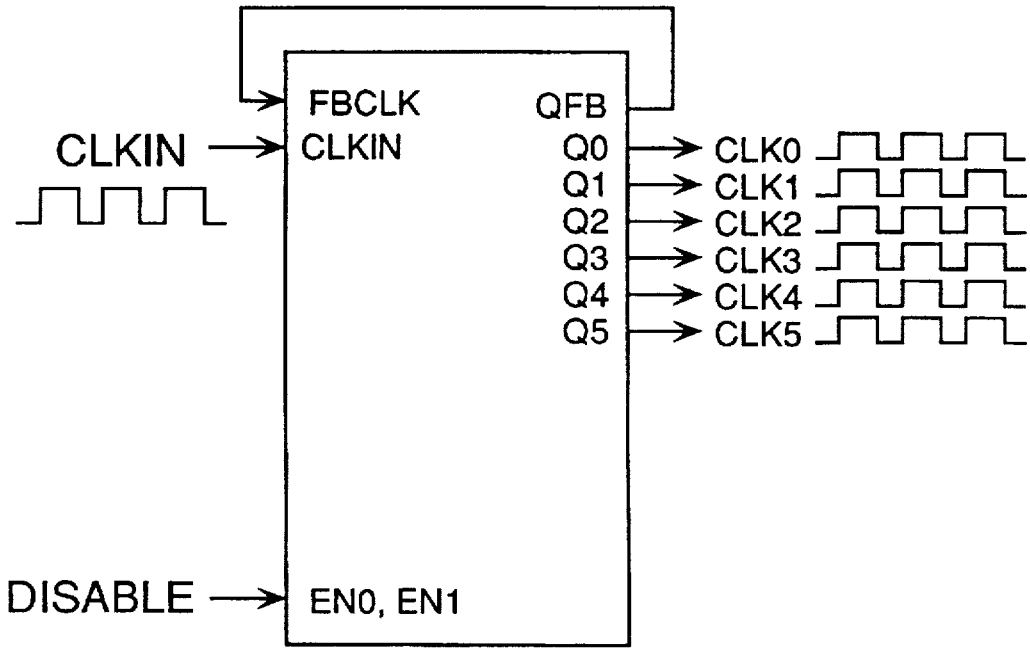

FIG. 7 shows a configuration where the structure of FIG. 3 is configured as a low-skew clock buffer with zero delay between a CLKIN transition and an output clock transition at terminals Q0–Q5. Input signals into the clock buffer are identical to those described with respect to FIG. 4. In this configuration, the logic array circuit generates clock signals on output terminals Q0–Q5 which are precisely in phase with each other. Each clock signal would then be applied to a respective external device. In the prior art, a single clock signal would need to be buffered be a driver associated with each external device. The aggregate loading and delay of these various buffers could cause distortion of the original signal and also cause the various clock signals generated to be skewed with respect to the original clock signal. This causes the various devices connected to these clock buffers to undesirably be clocked out of phase with the original clock signal.

The low-skew clock buffer of FIG. 7 may be cascaded so as to generate any number of low-skew, zero delay clock signals.

Figure 8:
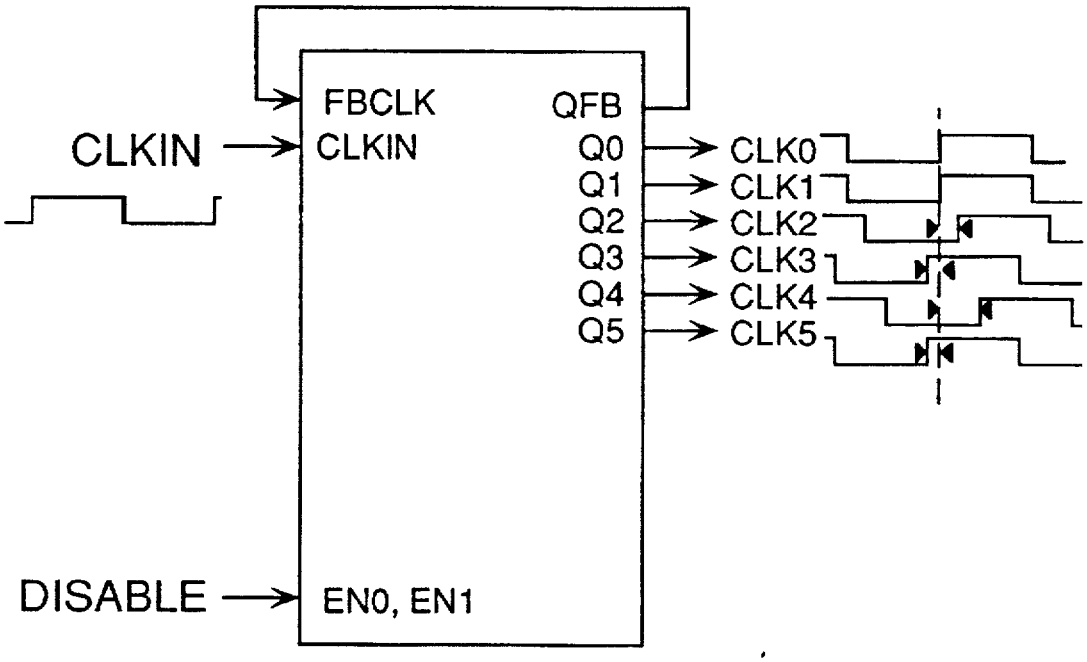

FIG. 8 shows a configuration where the structure of FIG. 3 is configured as a multi-phase clock buffer. Input signals into the clock buffer of FIG. 8 are identical to those described with respect to FIG. 4. This circuit funds utility where the propagation delays between the output terminals Q0–Q5 and the devices to which these clock signals are to be applied are not all identical, such as due to different wire lengths. Thus, any clock output on output terminals Q0–Q5 may be retarded or advanced in phase to compensate for the different propagation delays associated with that output terminal. This is enabled by the high frequency internal clocking of the logic array chip, where the accuracy of the various delays may be increased by providing a higher frequency internal clock.

Of course, the state machines of FIGS. 1 and 3 may be modified to have more input terminals or more output terminals as necessary for a particular application. Further, AND array 10 or OR array 30 in FIG. 1 may comprise any number of gates with any number of inputs as necessary for a particular application and may be programmable or non-programmable. Numerous other applications of the concept described herein of an internal clock generator for clocking the various registers of a state machine will be understood by those of ordinary skill in the art. Additionally, the output of PLL 47 or PLL 78 in FIGS. 1 and 3, respectively, may be used to clock only selected registers within the state machine while the externally generated clock signal may be used to clock other registers.

The circuits descried with respect to FIGS. 1 and 3 may be implemented in silicon or compound semiconductor technology, such as gallium arsenide for increased speed. Further, the circuits of FIG. 1 and 3 way be implemented using multiple chips or a monolithic design.

Additionally, the circuits of FIG. 1 and 3 may be implemented using either single-ended or differential circuitry, and signals generated may be active high or active low, whichever is desirable. Clock signals applied to or outputted from the phase-locked loop 78 may be positive or negative polarity. Any additional type of coupling or technique used in previous programmable logic array type circuits may be used in conjunction with or instead of the techniques described with respect to the circuits of FIGS. 1 and 3, since the novel aspects of the invention are broadly applicable.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of the invention.

What is claimed is:

1. A state machine structure comprising:

logic array means having input leads and output leads;

at least one register means having input terminals coupled to said output leads of said logic array means and having output terminals coupled to said input leads of said logic array means; and clock generating means for generating a clock signal having a frequency different than a reference signal applied to said clock generating means, said clock generating means having an output coupled to a clock input terminal of one or more of said register means; wherein said clock generating means incorporates a phase-locked loop having first and second inputs, and having said reference signal coupled to said first input of said phase-locked loop, and an output terminal of said register means coupled to said second input of said phase-locked loop.

2. The structure of claim 1 wherein said structure is a monolithic structure.

3. The structure of claim 2 wherein said coupling between said output terminal of said register means and said second input of said phase-locked loop is accomplished through a connection external to said monolithic structure.

4. The structure of claim 2 wherein said logic array means comprises an AND array means having input leads and output leads, an OR array means having input leads coupled to said output leads of said AND array means and having output leads, said register means having input terminals coupled to said output leads of said AND array means, but not coupled to said output leads of said OR array, and having output terminals coupled to said input leads of said AND array means.

5. The structure of claim 2 wherein said coupling between said output terminal of said register means and said second input of said phase-locked loop is accomplished through a connection internal to said monolithic structure.

6. The structure of claim 2 wherein said reference signal is an externally generated clock signal.

7. The structure of claim 2 wherein said logic array means comprises:

AND array means for performing functional AND operations having input leads and output leads; and OR array means for performing functional OR operations having input leads coupled to said output leads of said AND array means and having output leads.

8. The structure of claim 7 wherein said AND array means is programmable.

9. The structure of claim 7 wherein at least one of said register means comprises output register means having input terminals coupled to said output leads of said OR array means and having output terminals coupled to output leads of said structure.

10. The structure of claim 9 wherein at least one other of said register means comprises buried register means having input terminals coupled to one or more of said output leads of said logic array means and having output terminals coupled to one or more input terminals of said logic array means, and wherein said output of said clock generating means is coupled to clock input terminals of one or more of said buried register means.

11. The structure of claim 10 wherein said buried register means and said output register means comprise flip flops.

12. The structure of claim 7 further including an end count register having an input terminal coupled to an output of said AND array and an output terminal connected to an input of said AND array.

13. The structure of claim 7 wherein external outputs are coupled to said state machine through respective input latches, and wherein said input latches are enabled at a rate different than the rate of said clock signal generated by said clock generating means.

14. A monolithic structure comprising:

a state machine having one or more input terminals and a plurality of output terminals;

at least one register means having input terminals coupled to said output terminals of said state machine and having a plurality of output terminals; and a phase-locked loop clock generating means to supply a feedback signal for comparison with a reference signal;

one of said output terminals of said register means coupled to an input of said phase-locked loop clock generating means, said register means having an associated clock input terminal coupled to an output of said phase-locked loop clock generating means.

15. A circuit comprising:

a clock generating means having [one or more] input leads and one or more output leads, at least one of said input leads being coupled for receiving an externally generated periodic reference signal, and outputting one or more clock signals on said output leads; [and]

an output means having one or more input leads coupled to at least one of said output leads of said clock generating means and outputting [a plurality of individually] *one or more* controllable signals on one or more output leads of said output means which transition at a time referenced to transitions of said reference signal regardless of any internal propagation delays of said circuit[;]

[wherein] *said clock generating means and said output means being formed on a packaged monolithic chip; and*

*one of said controllable signals being applied to one of said input leads of said clock generating means via a conductor external to said packaged monolithic chip so that* said [plurality of individually] *one or more* controllable signals are phase-aligned or selectively phase-shifted with said externally generated periodic reference signal.

16. A circuit whose output signals are made to transition at a time reference to a time of transition of an externally generated referenced signal applied to said circuit regardless of any internal propagation delays of said circuit, said circuit comprising:

means for receiving an externally generated periodic reference signal and a feedback signal and for providing an output clock signal at a frequency different than said reference signal;

logic array means for receiving input signals and for performing logical functions on said input signals and for providing results of said logical functions at output terminals of said logic array means; and one or more register means, at least one of said register means having one or more input terminals coupled to said output terminals of said logic array means and having one or more output terminals coupled to inputs of said logic array means, at least one of said register means including an output terminal for providing said feedback signal, and at least one of said register means having a clock input terminal coupled to receive said output clock signal.

17. The circuit of claim 16 wherein said means for receiving incorporates a phase-locked loop having a first and a second input, and having said reference signal coupled to said first input, and an output terminal of one of said register means coupled to said second input of said phase-locked loop.

18. The structure of claim 17 wherein said structure is a monolithic structure.

19. The structure of claim 18 wherein said coupling between said output terminal of one of said register means and said second input of said phase-locked loop is accomplished through a connection external to said monolithic structure.

20. The structure of claim 18 wherein said coupling between said output terminal of one of said register means and said second input of said phase-locked loop is accomplished through a connection internal to said monolithic structure.

21. The structure of claim 18 wherein said logic array means comprises:

AND array means for performing functional AND operations having input leads and output leads; and OR array means for performing functional OR operations having input leads coupled to said output leads of said AND array means and having output leads.

22. The structure of claim 21 wherein said AND array means is programmable.

23. The structure of claim 21 wherein at least one of said register means comprises output register means having input terminals coupled to said output leads of said OR array means.

24. The structure of claim 23 further comprising one or more buried register means having input terminals coupled to said output terminals of said logic array means and having output terminals coupled to input terminals of said logic array means, and wherein said output of said clock generating means is coupled to clock input terminals of one or more of said buried register means.

25. A monolithic structure comprising:

a state machine having one or more input terminals and a plurality of output terminals;

at least one register means, at least one of said register means having input terminals coupled to said output terminals of said state machine and having a plurality of output terminals; and clock generating means incorporating a phase-locked loop for generating a clock signal having a frequency different than a reference signal applied to said clock generating means, sad clock generating means having an output coupled to a clock input terminal of one or more of said register means, one of said output terminals of said register means being coupled to an input of said clock generating means for supplying a feedback signal to be compared with said reference signal.

26. The structure of claim 25 wherein said reference signal is an externally generated clock signal.

27. The structure of claim 25 wherein said state machine comprises:

AND array means for performing functional AND operations having input leads and output leads; and OR array means for performing functional OR operations having input leads coupled to said output leads of said AND array means and having output leads.

28. The structure of claim 27 wherein said AND array means is programmable.

29. The structure of claim 27 wherein at least one of said register means comprises output register means having input terminals coupled to said output leads of said OR array means.

*30. A state machine structure comprising:*

*a logic circuit having input leads and output leads;*

*at least one register means having input terminals coupled to said output leads of said logic circuit and having output terminals coupled to said input leads of said logic circuit; and*

*clock generating means for generating a clock signal having a frequency different than a reference signal applied to said clock generating means, said clock generating means having an output coupled to a clock input terminal of one or more of said register means;*

*wherein said clock generating means incorporates a phase-locked loop having first and second inputs, and having said reference signal coupled to said first input of said phase-locked loop, and an output terminal of said register means coupled to said second input of said phase-locked loop.*

*31. A clock distribution circuit comprising:*

*a clock receiving means having input leads and one or more output leads, at least one of said input leads being coupled for receiving an externally generated periodic reference clock signal, and outputting one or more clock signals on said output leads;*

*an output circuit having one or more input leads coupled to at least one of said output leads of said clock receiving means and outputting one or more signals on one or more output leads of said output circuit which transition at a time referenced to transitions of said reference signal regardless of any internal propagation delays of said clock distribution circuit, said clock receiving means and said output circuit being formed on a packaged monolithic chip; and*

*one of said one or more signals being applied to one of said input leads of said clock receiving means via a conductor external to said packaged monolithic chip so that said one or more signals are phase-aligned or selectively phase-shifted with said externally generated periodic reference clock signal.*

*32. A circuit of whose output signals are made to transition at a time referenced to a time of transition of an externally generated reference signal applied to said circuit regardless of any internal propagation delays of said circuit, said circuit comprising:*

*means for receiving an externally generated periodic reference signal and a feedback signal and for providing an output clock signal at a frequency different than said reference signal;*

*a logic circuit for receiving input signals and for performing logical functions on said input signals and for providing results of said logical functions at output terminals of said logic circuit; and*

*one or more register means, at least one of said register means having one or more input terminals coupled to said output terminals of said logic circuit and having one or more output terminals coupled to inputs of said logic circuit, at least one of said register means including an output terminal for providing said feedback signal, and at least one of said register means having a clock input terminal coupled to receive said output clock signal.*

*33. A clock distribution circuit comprising:*

*means for receiving an externally generated periodic reference signal and a feedback signal on input leads and for providing an output clock signal on one or more output leads at a frequency different from said reference signal; and*

*an output circuit having one or more input leads coupled to at least one of said output leads of said means for receiving and outputting one or more signals on one or more output leads of said output circuit which transition at a time referenced to transitions of said reference signal regardless of any internal propagation delays of said clock distribution circuit, said means for receiving and said output circuit being formed on a packaged monolithic chip; and*

*one of said one or more signals being applied to one of said input leads of said means for receiving via a conductor external to said packaged monolithic chip so that said one or more signals are phase-aligned or selectively phase-shifted with said externally generated periodic reference signal.*

*34. The circuit of claim 31 wherein said clock receiving means is a phase-locked loop.*

*35. The circuit of claim 33 wherein said means for receiving is a phase-locked loop.*

*36. A circuit for generating clock signals synchronized with a reference clock signal comprising:*

*one or more logic circuits, each having a clock input terminal and an output terminal;*

*a phase-locked loop having a reference input terminal, a feedback input terminal, and an output terminal;*

*clock input terminals of said one or more logic circuits being coupled to said output terminal of said phase-locked loop, said one or more logic circuits and said phase-locked loop being formed as an integrated circuit encapsulated in a package;*

*a feedback output terminal of one of said one or more logic circuits being connected to said feedback input terminal of said phase-locked loop via a conductor external to said package; and*

*one or more package output terminals extending from said package and connected to one or more output terminals of said one or more logic circuits, said package output terminals for providing clock signals synchronized with a reference signal connected to said reference input terminal of said phase-locked loop when said feedback output terminal is connected to said feedback input terminal of said phase-locked loop.*

*37. The circuit of claim 36 wherein said one or more logic circuits generate signals at a frequency which is a fraction of a frequency of said reference signal.*

*38. The circuit of claim 36 wherein said one or more logic circuits generate signals at a frequency which is a multiple of a frequency of said reference signal.*

*39. The circuit of claim 36 wherein said one or more logic circuits generate signals at a frequency which is the same frequency as said reference signal.*

*40. The circuit of claim 36 wherein each of said one or more logic circuits includes a storage element.*

*41. The circuit of claim 40 wherein said storage element is a flip-flop.*

*42. The circuit of claim 36 wherein said phase-locked loop includes a voltage controlled oscillator.*

*43. The circuit of claim 36 wherein an output frequency of said phase-locked loop is different from a frequency of said reference signal.*

*44. The circuit of claim 36 wherein said one or more logic circuits are clocked at an output frequency of said phase-locked loop.*

*45. The circuit of claim 36 wherein said one or more logic circuits output a signal at an output frequency of said phase-locked loop.*

*46. The circuit of claim 36 further comprising a means for selecting an output frequency of signals applied to said one or more package output terminals.*

*47. A circuit for generating clock pulses comprising:*

*a phase-locked loop having a reference signal terminal, a feedback signal terminal, and an output terminal;*

*a plurality of registers, each register having a clock input connected to receive a clock signal corresponding to a signal on said output terminal of said phase-locked loop, said plurality of registers having respective register output terminals, one of said register output terminals providing a feedback signal, other ones of said register output terminals providing clock pulses for external circuits;*

*said phase-locked loop and said plurality of registers being provided on the same monolithic circuit; and*

*a conductor, external to said monolithic circuit, connected between said one of said register output terminals providing said feedback signal and said feedback signal terminal of said phase-locked loop.*

*48. The circuit of claim 47 wherein at least one of said plurality of registers generates signals at a frequency which is a fraction of a frequency of a reference signal applied to said reference signal terminal.*

*49. The circuit of claim 47 wherein at least one of said plurality of registers generates signals at a frequency which is a multiple of a frequency of a reference signal applied to said reference signal terminal.*

*50. The circuit of claim 47 wherein at least one of said plurality of registers generates signals at a frequency which is the same frequency as a reference signal applied to said reference signal terminal.*

*51. The circuit of claim 47 wherein at least one of said registers is a flip-flop.*

*52. The circuit of claim 47 wherein said phase-locked loop includes a voltage controlled oscillator.*

*53. The circuit of claim 47 wherein an output frequency of said phase-locked loop is different from a frequency of a reference signal applied to said reference signal terminal.*

*54. The circuit of claim 47 wherein said plurality of registers are clocked at an output frequency of said phase-locked loop.*

*55. The circuit of claim 47 wherein said plurality of registers output signals at an output frequency of said phase-locked loop.*

*56. The circuit of claim 47 further comprising a means for selecting an output frequency of signals applied to said one or more output terminals.*

*57. The circuit of claim 15 wherein said clock generating means is a phase-locked loop.*

* * * * *